United States Patent
Hershberg et al.

(10) Patent No.: US 10,230,347 B2
(45) Date of Patent: Mar. 12, 2019

(54) TELECOMMUNICATIONS DEVICE COMPRISING AN EBD CIRCUIT, A TUNABLE IMPEDANCE NETWORK AND A METHOD FOR TUNING A TUNABLE IMPEDANCE NETWORK

(71) Applicants: IMEC VZW, Leuven (BE); VRIJE UNIVERSITEIT BRUSSEL, Brussels (BE)

(72) Inventors: Benjamin Hershberg, Leuven (BE); Barend Wilhelmus Marinus Van Liempd, Leuven (BE); Jan Craninckx, Boutersem (BE)

(73) Assignees: IMEC vzw, Leuven (BE); Vrije Universiteit Brussel, Brussel (BE)

( * ) Notice: Subject to any disclaimer, the term of this patent is extended or adjusted under 35 U.S.C. 154(b) by 0 days.

(21) Appl. No.: 15/217,927

(22) Filed: Jul. 22, 2016

(65) Prior Publication Data
US 2017/0026022 A1    Jan. 26, 2017

(30) Foreign Application Priority Data

Jul. 24, 2015 (EP) .................................. 15178340

(51) Int. Cl.
*H03H 7/38* (2006.01)
*H03H 7/46* (2006.01)
(Continued)

(52) U.S. Cl.
CPC .............. *H03H 7/38* (2013.01); *H03H 7/463* (2013.01); *H04B 1/18* (2013.01); *H04B 1/52* (2013.01); *H03H 2007/386* (2013.01)

(58) Field of Classification Search
CPC .... H03H 7/38; H03H 7/463; H03H 2006/386; H04B 1/18; H04B 1/52

(Continued)

(56) References Cited

U.S. PATENT DOCUMENTS

| 2004/0263411 A1 | 12/2004 | Fabrega-Sanchez et al. |
| 2008/0123771 A1 | 5/2008 | Cranford et al. |
| 2013/0241670 A1* | 9/2013 | Mikhemar ............... H04B 1/52 333/126 |

FOREIGN PATENT DOCUMENTS

| EP | 2214310 A1 | 8/2010 |
| WO | WO 2013/188243 A1 | 12/2013 |

OTHER PUBLICATIONS

S. Abdelhalem, P. Gudem, and L. Larson, "Tunable CMOS Integrated Duplexer With Antenna Impedance Tracking and High Isolation in the Transmit and Receive Bands," Microwave Theory and Techniques, IEEE Transactions on, vol. 62, No. 9, pp. 2092-2104, Sep. 2014; 13 pgs.

(Continued)

*Primary Examiner* — Stephen E. Jones
*Assistant Examiner* — Samuel S Outten
(74) *Attorney, Agent, or Firm* — Knobbe Martens Olson & Bear, LLP

(57) ABSTRACT

A system having a tunable impedance network and a method of tuning a tunable impedance network are disclosed. In one aspect, a telecommunications device comprises an electrical-balance duplexer (EBD) circuit coupled to at least one output node of a transmit path (TXin), an antenna, and at least one input node of a receive path (RXout), wherein the EBD circuit is configured to isolate the transmit path from the receive path by signal cancellation, and a balancing network (Zbal) as part of the EBD circuit. In one embodiment, the balancing network is an integrated tunable impedance network configured to provide an impedance that matches a target impedance (Zant) associated with the antenna at a first frequency and simultaneously at a second, different frequency. The network comprises a first portion and a second portion, the first portion reducing the influence (Continued)

of the tuning of the second portion at the first frequency. In some embodiments, the network preferably comprises no explicit resistors.

18 Claims, 6 Drawing Sheets

(51) Int. Cl.
  *H04B 1/18* (2006.01)
  *H04B 1/52* (2015.01)
(58) Field of Classification Search
  USPC .......................................... 333/124
  See application file for complete search history.

(56) References Cited

OTHER PUBLICATIONS

Search Report received in EP Application No. 15178340 dated Feb. 4, 2016, 10 pgs.

M. Mikhemar, H. Darabi, and A. Abidi, "A Multiband RF Antenna Duplexer on CMOS: Design and Performance," Solid-State Circuits, IEEE Journal of, vol. 48, No. 9, pp. 2067-2077, Sep. 2013; 11 pgs.

B. van Liempd, B. Debaillie, J. Craninckx, C. Lavin, C. Palacios, S. Malotaux, J. Long, D. van den Broek, and E. Kiumperink, "RF selfinterference cancellation for full-duplex," in Cognitive Radio Oriented Wireless Networks and Communications (CROWNCOM), 2014 9th International Conference on, Jun. 2014, pp. 526-531; 6 pgs.

B. van Liempd, B. Hershberg, K. Raczkowski, S. Ariumi, U. Karthaus, K.-F. Bink, and J. Craninckx, "A +70dBm IIP3 single-ended electrical-balance duplexer in 0.18um SOI CMOS," in Solid-State Circuits Conference—(ISSCC), 2015 IEEE International, Feb. 2015, pp. 1-3; 3 pgs.

T. Dinc and H. Krishnaswamy, "A T/R Antenna Pair with Polarization-Based Reconfigurable Wideband Self-Interference Cancellation for Simultaneous Transmit and Receive", Radio Frequency Integrated Circuits Symposium, May 2015; 4 pgs.

\* cited by examiner

TELECOMMUNICATIONS DEVICE COMPRISING AN EBD CIRCUIT, A TUNABLE IMPEDANCE NETWORK AND A METHOD FOR TUNING A TUNABLE IMPEDANCE NETWORK

CROSS-REFERENCE TO RELATED APPLICATIONS

This application claims foreign priority to EP application No. 15178340.4, filed Jul. 24, 2015. The contents of each are incorporated by reference herein in entirety.

BACKGROUND

Field

The present disclosure relates to a telecommunications device comprising an electrical-balance duplexer (EBD) circuit, and a tunable impedance network and method for tuning a tunable impedance network that can be used with the EBD circuit or in other applications.

Description of the Related Technology

An electrical-balance duplexer (EBD) is a tunable RF frontend concept that addresses some of the key challenges of 4G and 5G mobile systems. The basic principle of the EBD is shown in FIG. 1. Duplexer isolation is achieved when the signals in paths 1 and 2 cancel and prevent the TX signal from appearing at the RX port. This cancellation is achieved by balancing the antenna port's impedance $Z_{ANT}$ with a tunable on-chip impedance $Z_{BAL}$, hence the name 'electrical-balance'.

Wireless devices now support an increasing number of 4G FDD bands, and a tunable integrated solution like this could potentially replace several fixed-frequency filters and switches. The EBD is also attractive for 5G in-band full-duplex (FD) communication systems. Whereas a filtering-based duplexer cannot isolate the TX and RX ports for the special case where $f_{TX}=f_{RX}$, the EBD's signal cancellation approach still works.

However, the entire EBD concept depends on the capability to tune $Z_{BAL}$ into balance with $Z_{ANT}$. This needs to happen not just at a single frequency, but across the entire bandwidth of both the TX and RX channels. Additionally, the impedance characteristic of the antenna will vary significantly over time due to interaction with the user and environment. Designing a $Z_{BAL}$ that is generic enough to work with real cellular antennas is therefore a challenge.

Although many papers have reported EBD isolation levels of more than 40 dB across bandwidths ranging from 10's to 100's of MHz, these are all for highly selective 'best-case' scenarios which are not applicable to real world conditions. For example, a tunable integrated duplexer with dual-frequency tuning is known in the art, where the provided coverage is limited to selective best-cases.

SUMMARY OF CERTAIN INVENTIVE ASPECTS

It is a first advantage of the present disclosure to provide a fully integrated solution for multi-frequency impedance tuning that can effectively be used in a telecommunications device.

This first advantage is achieved according to a first aspect of this disclosure with a telecommunications device comprising an electrical-balance duplexer, EBD, circuit coupled to at least one output node of a transmit path (TXin), an antenna, and at least one input node of a receive path (RXout), the EBD circuit being configured to isolate the transmit path from the receive path by signal cancellation, and a balancing network as part of the EBD circuit, wherein the balancing network is an integrated tunable impedance network configured to provide an impedance that matches a target impedance associated with the antenna at a first frequency and simultaneously at a second frequency, the first and second frequencies being different from each other, and wherein the integrated tunable impedance network comprises an input port and at least one impedance branch with a plurality of reactive elements and associated tuning components connected to the input port, wherein the number of reactive elements and associated tuning components, their topology and their reactance values are such that the respective impedance branch is tunable to match the target impedance at the first frequency by means of mainly a first portion of the impedance branch and to match the target impedance at the second frequency by means of mainly a second portion of the impedance branch, the first portion being closer to the input port than the second portion and reducing the influence of the tuning of the second portion at the first frequency.

With "matching" to a target impedance at a frequency is meant that the network, impedance branch, or a portion thereof, is tuned to form or synthesize an impedance that substantially matches or balances or replicates the target impedance at that frequency.

As mentioned above, the integrated tunable impedance network of the present disclosure is able to provide an impedance that matches a target impedance simultaneously at (at least) two different frequencies. In embodiments, the first and second frequencies can be either a transmit frequency of the device or a receive frequency of the device, or can be two frequencies to create a span across the channel while the device transmits and receives at the same frequency (within the span, for example in the centre), or can be a transmit/receive frequency and a harmonic thereof, etc.

The first and second portions of the impedance branch are—as will be apparent from the explanations given herein—not necessarily clearly distinguishable portions of the respective impedance branch. By the wording "closer to the input port" is meant that the first portion is clearly a part of the impedance branch located at the side of the input port of the network and the second portion is located behind or "downstream from" the first portion. In particular, the respective branch is tunable in such a way that by means of (mainly) the first portion, the matching to the target impedance at the first frequency can be obtained, and that by means of (mainly) the second portion, the matching to the target impedance at the second frequency can be obtained. But part of the respective branch, in particular a part in the middle, can depending on the settings of the branch form part of the first portion or the second portion.

By the wording "the first portion reducing the influence of the second portion at the first frequency" is meant that the impedance branch of the network is tunable in such a way that the first portion provides the matching at the first frequency and that, when this matching at the first frequency is achieved, the second portion is tunable substantially independently to provide the matching at the second frequency. Alternatively worded, the branch is configured such that it can be tuned first as a whole, possibly in a few iterations, to provide the matching at the first frequency and that subsequently tuning can only occur in the second ("downstream") part to provide the matching at the second frequency, substantially without affecting the already achieved matching at the first frequency. It is remarked that the first and second portions according to the present disclosure are not fixed portions of the network in the sense that, depending on the frequencies, different stages of the network may form part of the first and second portions, and furthermore there may be an intermediate portion between the two, the components of which influence the impedance at both frequencies.

As a result, embodiments according to the first aspect can provide a systematic approach to designing, validating, and controlling a fully-integrated tunable impedance network capable of generating arbitrary impedances at two or more different frequencies simultaneously across practical tuning ranges. This can be achieved because, as explained above, in one or more impedance branches of the network an independent or near-independent way of changing $Z_{BAL}$ at the two frequencies of interest for the respective impedance branch can be achieved. This can be seen as an implementation of a kind of narrow-band filtering of impedance in the network topology: as seen from the input, the stages located at the input, i.e. the first portion in the impedance branch, transform the impedance of the subsequent stages, i.e. the second portion. By virtue of such a topology, the cumulative effect of these impedance transformations can be that the rear stages (the second portion) are transformed to a relatively higher impedance at the higher of the two frequencies of interest for the respective impedance branch. This means that the lower frequency "sees" the impedance of the rear stages more than the higher frequency does. The inventors have found that this approach can be highly effective for adjusting the impedance at the lower frequency independently or near-independently of the impedance at the upper frequency, and this in one or more branches of the same integrated network.

In embodiments according to the present disclosure, at least one impedance branch of the integrated tunable impedance network consists only of reactive elements and associated tuning components, i.e. does not contain any explicit resistors. This means that the only "resistor" components of the branch are parasitic resistive elements of all the reactive elements, also due to the present tuning components, e.g. switch devices. It is an advantage of such embodiments that a large impedance tuning range can be obtained for the overall network, such that the independent or near-independent tuning capabilities of the impedance at two frequencies can be enhanced.

In embodiments according to the present disclosure, in the at least one impedance branch, the number of reactive elements and associated tuning components, their topology and their reactance values are such that the respective impedance branch is tunable to match substantially any impedance within a predetermined region on the complex plane around the target impedance to track for impedance variation of the antenna at the first and second frequencies. For example, considering this on the Smith chart, this means that the respective impedance branch has sufficient redundancy for being able to match substantially any impedance within a predetermined region, e.g. a circle, around the target impedance on the Smith chart. It is an advantage of such embodiments that an impedance network may be obtained which can compensate for any practical impedance variation of the antenna at the first and second frequencies.

In embodiments according to the present disclosure, the integrated tunable impedance network comprises an input portion at the input port, provided for shifting the impedance of the network on the complex plane simultaneously at the first and second frequencies. This can be seen as a kind of wideband tunability of the impedance network, or a setting of the nominal impedance of the network. In certain embodiments, the input portion is preferably a common portion for all the branches of the network, i.e. all the impedance branches are connected to the same input portion. This input portion may for example comprise a variable capacitance ($C_1$) in parallel with a fixed inductance ($L_1$) between the input port and ground. It is an advantage of such embodiments with a (wideband) tunability at the input port, in combination with the subsequent tunable first and second portions, that dual-frequency tuning (in case of one branch) and multi-frequency tuning (in case of multiple branches) may be performed in a systematic and efficient way.

In embodiments according to the present disclosure, the first and second portions together consist of a sequence of impedance stages, each consisting of a first variable capacitance in parallel with a fixed inductance between a first node and a second node and a second variable capacitance between the second node and ground, the first node each time being connected to the second node of the previous stage. It is an advantage of such embodiments that a high-Q impedance network may be obtained with redundancy of reactive elements, so that a plurality of options are provided for performing the matching at the first and second frequencies, and this for any practical impedance variation of the antenna.

In embodiments according to the present disclosure, the sequence of impedance stages comprises a first set of impedance stages wherein the first variable capacitance has each time the same first tuning range and wherein the second variable capacitance has each time the same second tuning range, and a second set of impedance stages wherein the first and second variable capacitances have each time the same third tuning range. It is an advantage of such embodiments, that a high-Q impedance network may be obtained with redundancy of reactive elements, but in a structured way, such that tuning of the impedance network for performing the matching at the first and second frequencies may be obtained in a short time frame.

In embodiments according to the present disclosure, the integrated tunable impedance network is a termination port. In embodiments, the network may be single-ended, i.e. with a single input node, or a differential network, i.e. with two differential input nodes.

It is a second aim of the present disclosure to provide a high-Q fully integrated tunable impedance network for multi-frequency impedance tuning.

This second aim is achieved according to a second aspect of this disclosure with the integrated tunable impedance network of the second independent claim. Advantages and embodiments of the impedance network of the second aspect have already been described for the first aspect. The features of the second aspect can be implemented in conjunction with the features of the other aspects of this disclosure or on their own.

The tunable impedance network according to the second aspect can for example be used in a telecommunications device according to the first aspect, but also in any application where it is desired to set a terminating impedance precisely at more than one frequency (e.g. load termination optimization for transmission lines).

It is a third aim of the present disclosure to provide a systematic method, in particular a faster and/or less complex method, for tuning an integrated tunable impedance network to provide an impedance that matches a target impedance at a first frequency and simultaneously at a second frequency, the first and second frequencies being different from each other.

This third aim is achieved according to a third aspect of the disclosure with the method comprising the steps of the third independent claim. Advantages and embodiments of the tuning method of the third aspect have already been described for the first aspect. The features of the third aspect can be implemented in conjunction with the features of the other aspects of this disclosure or on their own. The tuning method according to the third aspect can for example be used in a telecommunications device according to the first aspect or on a tunable impedance network according to the second aspect, but also in other applications.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

Figure 1:
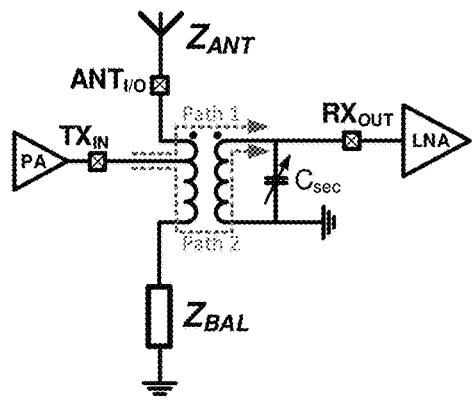
FIG. 1 shows an exemplary implementation of a telecommunication device employing an electrical balance duplexer.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

A frequency band is a frequency range defined by a specific communication scheme (as defined by a communication standards body e.g. 3GPP or IEEE) within which a communication device is licensed to operate, e.g. high-speed downlink package access (HSDPA), long-term evolution (LTE), or 802.11. Typically, in frequency-division duplexing (FDD) operation, the frequency bands within which the transmitter and the receiver device operate are in different, non-adjacent frequency ranges. The specific set of the transmitter frequency range and the received frequency range is referred to as a frequency band.

A communication channel is a sub-set of a frequency band within which one or more users are allocated to operate, wherein the width of the channel is defined by the specification of the particular communication standard. Any channel could be used as an uplink or downlink channel, or both in the case of in-band full-duplex operation (i.e. means of communication where the transmitter and receiver of a communications device are active concurrently over the same channel). The term "frequency" relates to the frequency at which the communication device, i.e. transmitter or receiver, operates. Strictly speaking, a frequency is a single point on the frequency spectrum with a zero bandwidth. Often, it is also used to mean the centre frequency of the communication channel within a finite bandwidth.

The proposed impedance tuning network can be used, for example, as a part of an EBD (see FIG. 1) employed in a communication device operation in e.g. in-band full-duplex (IBFD) or in frequency-division duplexing (FDD) operation mode. In the case of IBFD operation mode, the communication device transmits and receives simultaneously in the same communication channel. In such case, filtering of the TX leakage when sharing the same radiating element (i.e. antenna) cannot be done since the leakage occurs at the same frequency where one desires to receive signals. Therefore, in such application, cancellation of the TX leakage is required. An EBD is typically used in such communication devices for the cancellation of the TX leakage. It is an advantage of the EBD that signals can thus be cancelled, which makes it well suited for the application of IBFD communications. In this case, two sets of different example frequencies could be used as frequencies at which to obtain a target impedance associated with the antenna, namely (1) the shared TX/RX centre channel frequency and a desired harmonic frequency of the channel, to avoid the leakage of the TX harmonics which could degrade the RX SNR; and (2) using a set of two frequencies set within the TX/RX shared channel with the aim to increase the average isolation bandwidth, e.g. by placing the two frequencies off-centre in the TX/RX shared channel. A second application is the currently standardized FDD mode of operation, where the impedance of the tunable impedance network is to be matched to two different frequencies being the transmit and receive channels within their respective frequency bands. Other possible applications are in the terminating load optimization of transmission lines, e.g. as known in the art, where tunable impedances are used to provide optimum power transfer of a signal through a transmission line. In other existing systems, a simpler network topology would only allow to tune the load to a single impedance at a single frequency, whereas the proposed network according to this disclosure would allow tuning at two frequencies for load optimization of the transmission line. Another possible application is self-interference cancellation using a tuned reflective antenna load, which is also a tunable impedance, in a condition as proposed in the known art, where the reflected signal in the load provides a cancellation condition with a main leakage path from one antenna to the other, to obtain high signal cancellation. In said application, the proposed network according to this disclosure would allow for cancellation at two frequencies simultaneously to enable FDD operation, or it would allow for increased bandwidth in the application of IBFD, compared to other options for conventional tuning network implementations (e.g. as in the known art).

Herein, one advantageous tuning method is described for tuning the disclosed impedance networks. Another possible method of tuning a tunable impedance network would be to use general purpose algorithms, e.g. particle swarm optimization, genetic algorithm, using e.g. either deterministic or stochastic approaches. The basic principle of a telecommunications device based on an EBD circuit is described above, in the background section, with reference to FIG. 1. It is remarked that these explanations and FIG. 1 are also relevant for telecommunications devices according to this disclosure.

In this disclosure, embodiments are described to provide a systematic approach to designing, validating, and controlling a fully-integrated tunable impedance network capable of generating a variety of impedances at two different frequencies simultaneously across practical tuning ranges. Although the focus is on the topology and tuning of the balance network for specific application of the EBD circuit of FIG. 1, it is remarked that the principles of the balance network can be more generally applied to any problem where a terminating impedance must be precisely set at more than one frequency, a few examples of which have already been described above. It is evident that the details of the topology, e.g. the number of stages, components, their values etc. and also the tuning methodology may vary according to the requirements of the specific application, e.g. the frequencies at which the impedance is to be matched.

Figure 2:
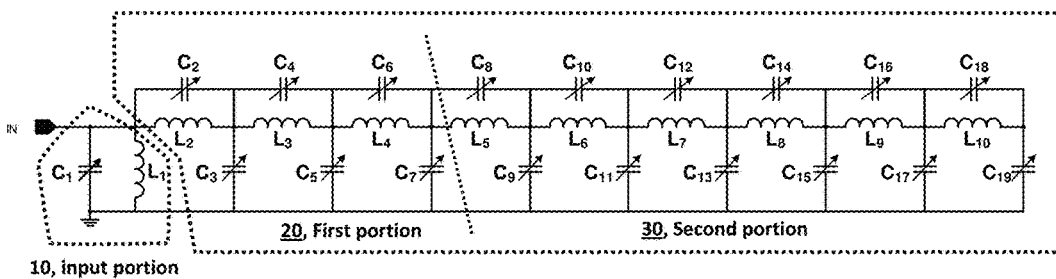
FIG. 2 shows an exemplary embodiment of a impedance tuning network according to the present disclosure.
Figure 3:
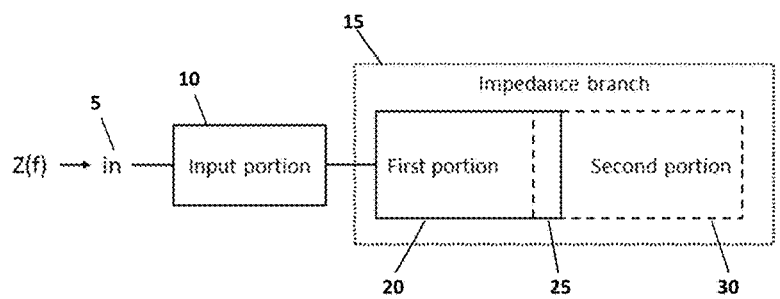
FIG. 3 shows the functionality of the embodiment of FIG. 2.

An embodiment of a suitable balance network is shown in FIG. 2, and on a higher level in FIG. 3. This embodiment comprises an input port 5 with a single branch 15. An input portion 10 of the network, comprising a variable capacitance C1 in parallel with a fixed inductance L1 between the input port and ground, provides for electrostatic discharge (ESD) protection by the inductive nature of the latter element, providing a low-frequency short to ground. Furthermore, this first portion 10 provides the largest possible tuning range of impedance since all further components' impedances are adapted when the first capacitor is changed. Therefore, the value of this input portion sets the overall network centre impedance and impedance tuning region at both frequencies. This will be described in more detail below.

Subsequent to the input portion, the single impedance branch 15 comprises the first and second portions 20, 30 of the network as described herein, which can from an operational point of view be considered as a narrowband filtering section as the first portion followed by a narrowband filtered translation section as the second portion (although the sections do not treat signals but transform impedances). The first and second portions together consist of a sequence of impedance stages, each consisting of a first variable capacitance C2, C4, C6, C8, . . . in parallel with a fixed inductance L2, L3, L4, L5, . . . between a first node and a second node and a second variable capacitance C3, C5, C7, C9, . . . between the second node and ground, the first node each time being connected to the second node of the previous stage. This provides a high-Q impedance network with redundancy of reactive elements, so that many options are provided for forming a matched impedance at the first and second frequencies, and this for any practical impedance variation of the antenna at the first and second frequencies. The variable capacitances may each time be implemented as switched capacitor banks.

Based on the specifics of the design specifications, the technology used for implementing each of the reactive elements, each reactive element can be designed with a different quality factor Q. For a tunable capacitor, the quality factor can be modelled e.g. as a simple equivalent capacitor connected in series with a resistor, such that in a switched capacitor implementation, e.g. the switch used in series with the capacitor designed for an overall Q of the tunable capacitor influences the overall Q of the network. For inductors, similarly, the width of the metal used to implement the windings of the inductor can determine its Q factor, in conjunction with the substrate resistance. Depending on the technology used, the windings can be set to the desired width such that a certain Q is obtained, up to a maximum limit which is set by technology design rules and substrate resistance of the technology. It can be a valid design choice, within the scope of this disclosure, to add resistive elements to the network by reducing the Q in the reactive components in the network, or to include fixed resistances, implemented e.g. as metal resistors, or by using any other option provided by the technology to implement resistive elements, so as to obtain the desired overall network impedance. For example, a resistor could be added at the end of the last portion if so desired to obtain a useful overall network impedance.

In subsequent portions of the example network, as shown in FIG. 2, an impedance ladder network is constructed with a series-L in shunt with a series-C, with a shunt-C attached to the end, which is also referred to as an impedance stage of the ladder network. The example network shows nine total impedance stages.

In particular, the sequence of impedance stages comprises a first set wherein the first variable capacitance has each time the same first tuning range and wherein the second variable capacitance has each time the same second tuning range, and a second set wherein the first and second switched variable capacitances have each time the same third tuning range. The tuneable capacitors may be implemented as a bank of switchable unit capacitors, i.e. Cu. Thus, by controlling the number of switched on or off unit capacitors, the capacitance value of the tuneable capacitor is varied. An example of possible values is summarized in Table 1 below, wherein the capacitance value of the unit capacitor in an on state (switched state), i.e. Con, is 116 fF and the capacitance value of the unit capacitor in an off state (not switched state), i.e. Coff, is 32 fF.

TABLE 1

COMPONENT VALUES FOR THE BALANCE NETWORK IN FIG. 2

| | |
|---|---|
| $L_1$ | 18.0 nH |
| $L_2$ | 9.0 nH |
| $L_3$-$L_{10}$ | 10.8 nH |
| $C_1, C_3, C_5, C_7, C_9, C_{11}$ | $40 \times C_U$ |
| $C_2, C_4, C_6, C_8, C_{10}$ | $28 \times C_U$ |
| $C_{12}$-$C_{19}$ | $48 \times C_U$ |

($C_U$: $C_{ON}$ = 116 fF, $C_{OFF}$ = 32 fF)

It is an advantage of this embodiment, that a high-Q impedance network may be obtained with redundancy of reactive elements, but in a structured way, such that tuning of the impedance network to form the desired target impedance at the first and second frequency may be obtained.

Figure 4:
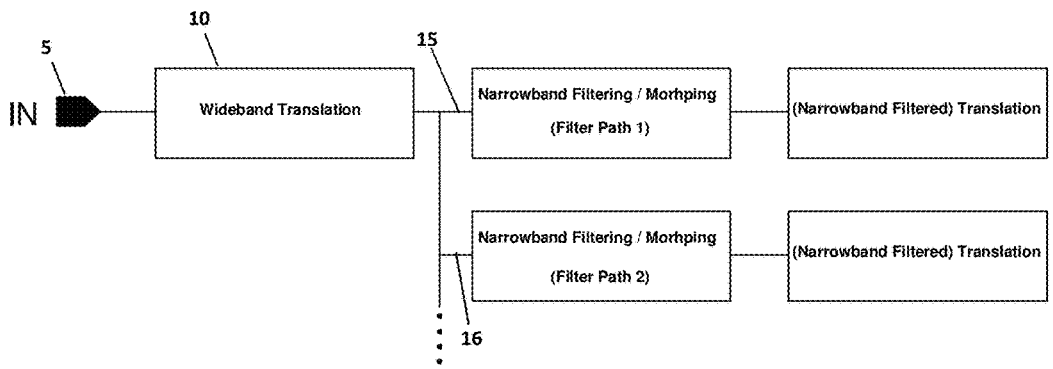
FIG. 4 shows an exemplary block scheme of a impedance tuning network according to the present disclosure.

In fact, the balance network of FIG. 2 can be considered, as shown in FIG. 3, as a sequence of the input portion 10, the first portion 20 and the second portion 30. As shown and explained below with respect to FIGS. 7 and 8, the first portion and the second portion have a cross-over region 25 between the two portions where, for different frequency combinations and applications, different capacitors cause independent control of the impedance at the first and second frequency. In other words, depending on the frequencies, this cross-over region may form part of the first portion, the second portion, or even both. The concept of FIG. 3 can be further generalized from a dual-frequency matching network to a poly-frequency matching network. One possible method for doing this would be to employ multiple impedance branches in the network, such as the topology shown in FIG. 4. Each impedance branch comprises a first portion and a second portion, represented in FIG. 4 by the functional blocks "narrowband filtering/morphing" followed by "(narrowband filtered) translation" for each branch 15, 16, . . . . It may be useful to employ different types of impedance branches in each path. For example, the impedance network of FIGS. 2-3 inherently produces a low-pass type filtering characteristic, so the lowest of the two frequencies is always the one which is tuned by the second portion (the narrowband filtered translation section), since it is the one that is most sensitive to the second portion's tunable components. With regards to FIG. 4, then, it may be advantageous to have some impedance branches (or filter paths) embody high-pass filters characteristics, others low-pass, and perhaps even band-pass for any additional branches.

Figure 5:
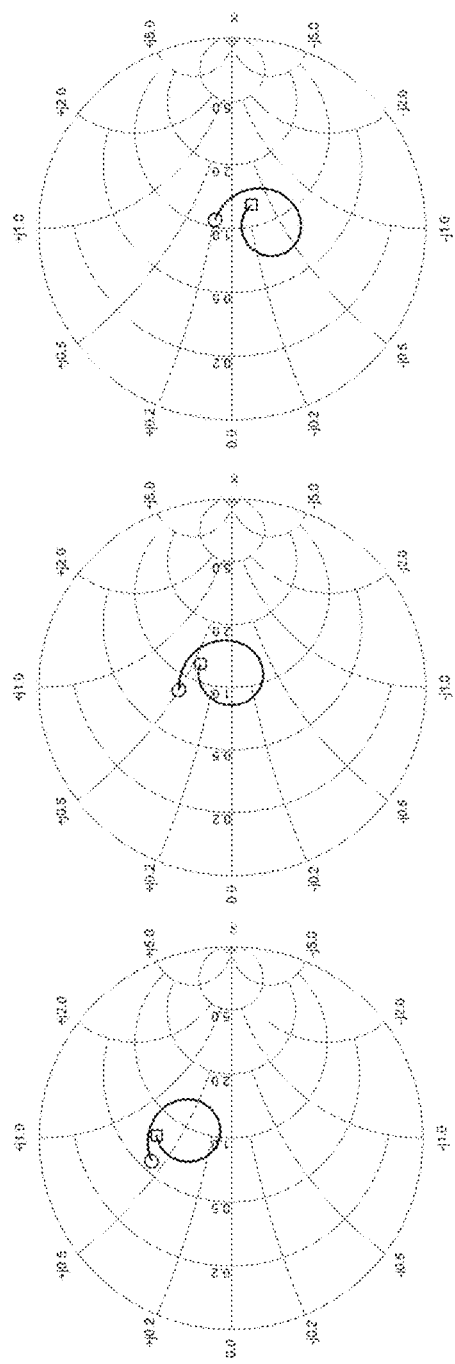
FIG. 5 shows the influence of the capacitor C1 on the impedance characteristic of the impedance tuning network of FIG. 2, for the case when the first and the second frequency are set 800 MHz and 900 MHz.
Figure 6:
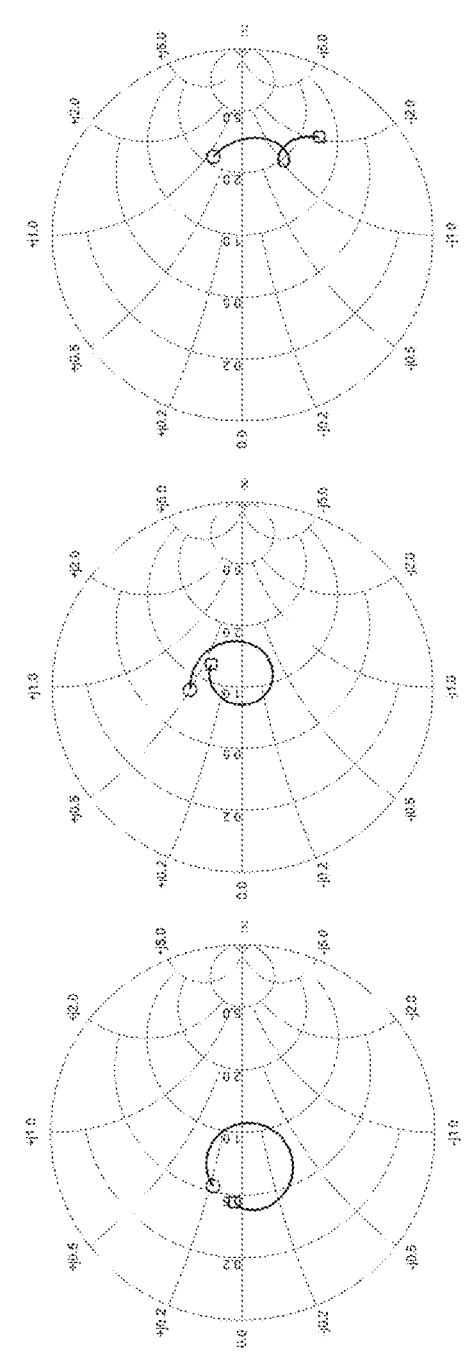
FIG. 6 shows the influence of the capacitor C2 on the impedance characteristic of the impedance tuning network of FIG. 2, for the case when the first and the second frequency are set 800 MHz and 900 MHz.

FIGS. 5 and 6 illustrate how the overall impedance of the impedance network is affected by tuning capacitors C1 and C2, respectively, for a target impedance at 800 MHz and 900 MHz. FIG. 5, shows that by tuning the capacitor C1 from a minimum (i.e. when none of the unit capacitors are switched on) to a maximum (i.e. when all unit capacitors are switched on) the reactance of the overall network is increased or decreased. More in details, FIG. 5 shows the overall impedance of the network for different values of capacitor C1, e.g. for a minimum value (i.e. 0×Cu), a middle value (i.e 20×Cu) and maximum value (i.e 40×Cu), shifting the overall impedance up and down across the Smith chart demonstrating an increased or decreased of the reactance value of the network. Similarly, FIG. 6 shows the overall impedance of the network for different values of capacitor C2, e.g. for a minimum value (i.e. 0×Cu), a middle value (i.e. 14×Cu) and maximum value (i.e 28×Cu), shifting the impedance left and right across the Smith chart demonstrating an increased or decreased real value of the overall network. In both figures, the rest of the capacitors are tuned to their middle value. Therefore, capacitors C1 and C2 (in conjunction with L1 and L2) set the overall centre impedance of the tuneable impedance network. Table 2 shows the middle value for each of the capacitors as well as the values of the inductances.

Figure 7:
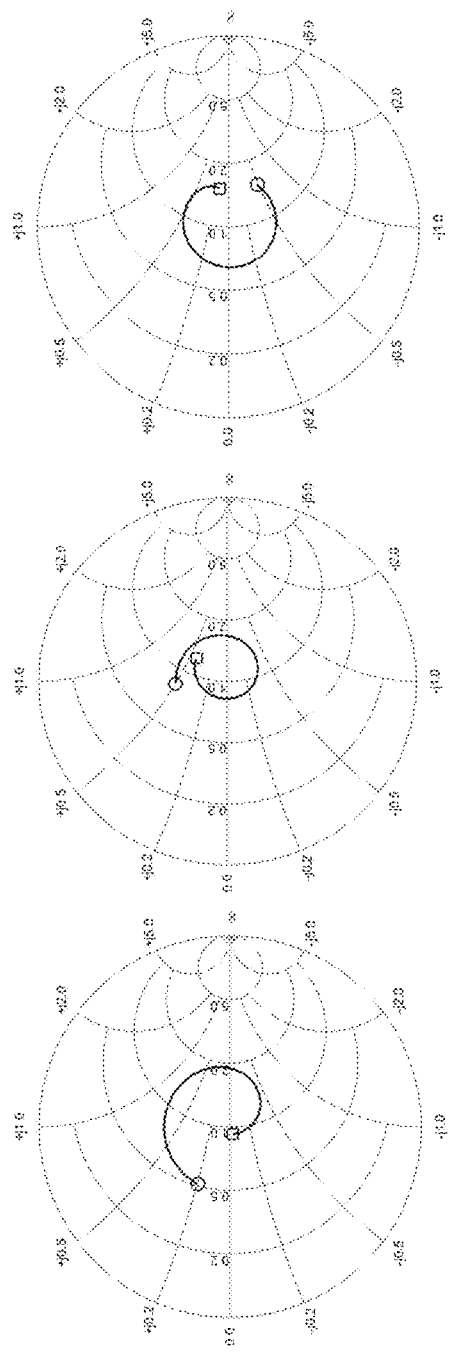
FIGS. 7-8 show the influence of the capacitors C10 and C13 respectively on the impedance characteristic of the impedance tuning network of FIG. 2, for the case when the first and the second frequency are set 800 MHz and 900 MHz.
Figure 8:
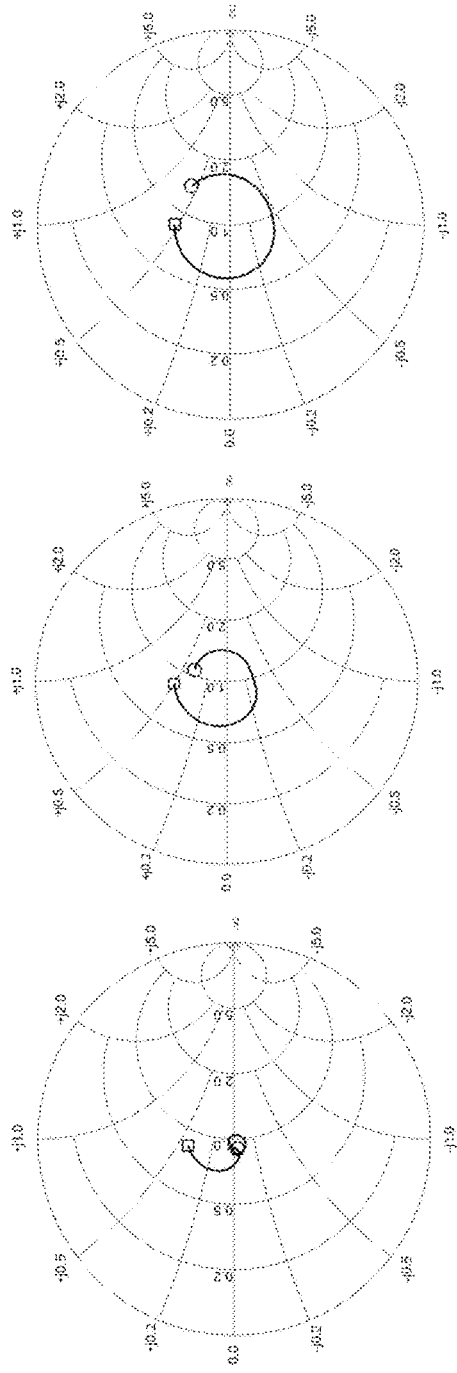

FIGS. 7-10 show how for different operating frequency the overall impedance of the network is affected by tuning the first portion and the second portion, respectively. More in details, FIGS. 7 and 8 show the effect of tuning capacitors C10 and C13, respectively, to a target impedance operating at 800 MHz (indicated with a circle) and 900 MHz (indicated with a square) frequencies.

TABLE 2

COMPONENT VALUES FOR THE BALANCE NETWORK OF FIG. 2 WITH CAPACITORS SET TO A MIDDLE VALUE.

| | |
|---|---|
| $L_1$ | 18.0 nH |
| $L_2$ | 9.0 nH |
| $L_3$-$L_{10}$ | 10.8 nH |
| $C_1, C_3, C_5, C_7, C_9, C_{11}$ | $20 \times C_U$ |
| $C_2, C_4, C_6, C_8, C_{10}$ | $14 \times C_U$ |
| $C_{12}$-$C_{19}$ | $24 \times C_U$ |

($C_U$: $C_{ON}$ = 116 fF, $C_{OFF}$ = 32 fF)

In FIG. 7, each tuneable capacitors is set to its middle value, i.e. to a half of its maximum value as shown in Table 2, while C10 is set to a minimum value (i.e. 0×Cu), a middle value (i.e. 14×Cu) and a maximum value (i.e. 28×Cu). As can be seen from the figure, the tuning of C10 affects the overall impedance of the network at both frequencies. Thus, in conjunction with FIGS. 5 and 6, it can be shown that tuning of capacitors C1 to C10 affects the overall impedance at both frequencies. However, tuning of the capacitors in the subsequent impedance stages, i.e. tuning of capacitors C11 to C19, affects the overall impedance mainly at the first frequency (i.e. 800 MHz), while the impedance at the second frequency is not changed. This can be seen from FIG. 8, which shows the overall impedance on the Smith chart for a minimum value (i.e. 0×Cu), a middle value (i.e. 24×Cu) and a maximum value (i.e. 48×Cu) of capacitor C13, and the other capacitors set to their middle value. In other words, in this case the impedance stages comprising capacitors C2 to C10 can be attributed to the first portion, while impedance stages comprising capacitors C11 to C19 can be attributed to the second portion.

Figure 9:
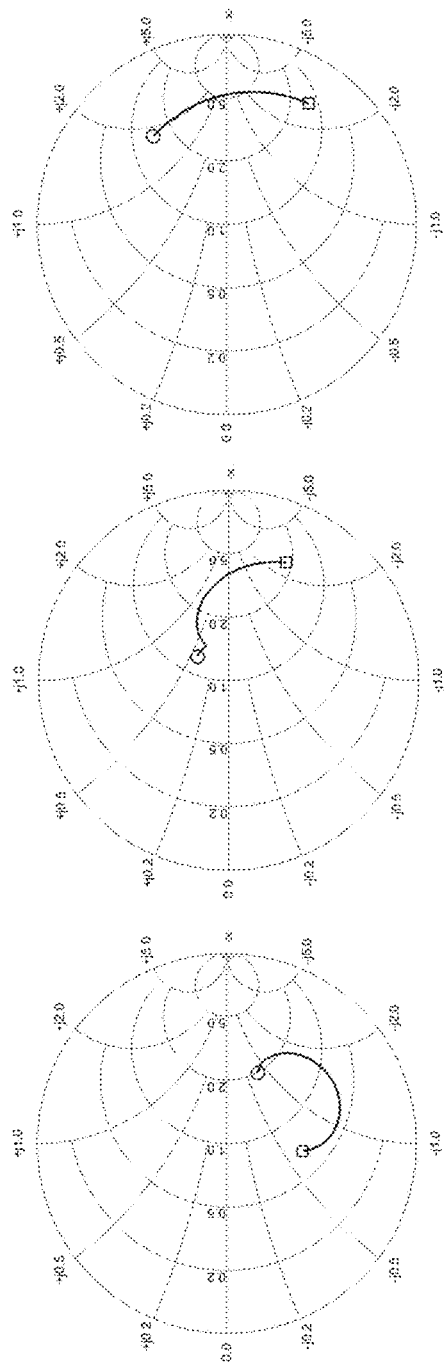
FIGS. 9-10 show the influence of the capacitors C4 and C7 respectively on the impedance characteristic of the impedance tuning network of FIG. 2 for the case when the first and the second frequency are set 900 MHz and 1000 MHz.
Figure 10:
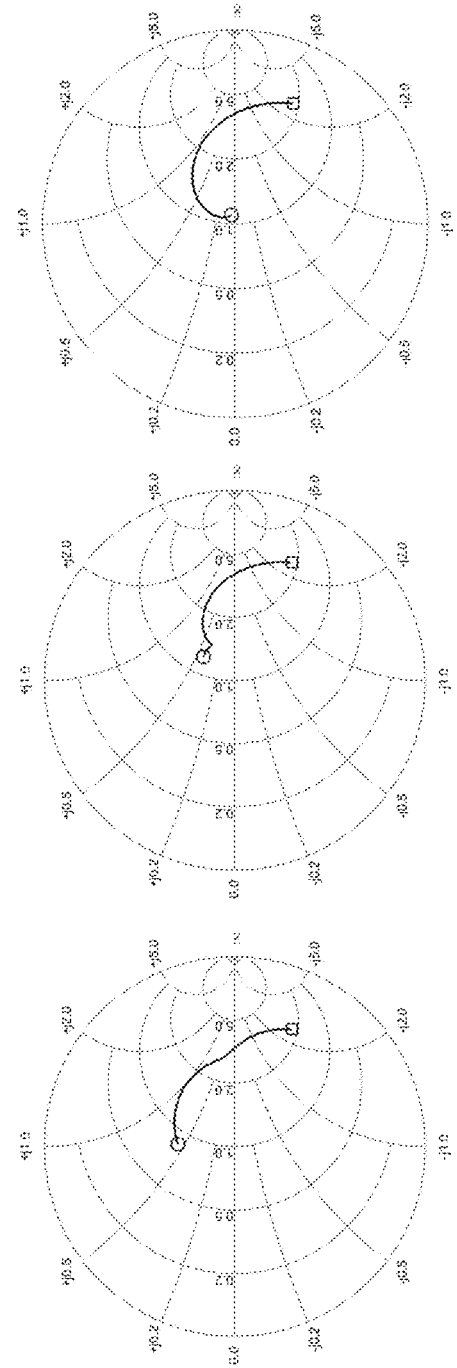

FIGS. 9 and 10 show the same measurement results but for a target impedance at 900 MHz (circle) and 1000 MHz (square). FIG. 9, which shows the overall impedance on the Smith chart for a minimum value (i.e. 0×Cu), a middle value (i.e. 14×Cu) and a maximum value (i.e. 28×Cu) of capacitor C4, and the other capacitors set to their middle value. FIG. 10 shows that tuning capacitor C7 to its minimum, middle and maximum value, has an effect on the overall impedance at the first frequency only. FIGS. 9-10 shows that capacitors C1 to C6 affect the impedance at both frequencies, while capacitors C7 to C19 affect the impedance at the first frequency only. In this case, the impedance stages comprising capacitors C2 to C6 can be attributed to the first portion, while impedance stages comprising capacitors C7 to C19 can be attributed to the second portion.

Thus, the effect of the tuning of the different impedance stages on the overall impedance network and hence the resulting separation between the first portion 20 and the second portion 30, can be different for different target frequencies. In addition, this separation is also affected by the value to which the tuneable capacitors are initially set (for example if tuneable capacitors are set to a half or to a quarter of their respective maximum value).

Therefore, a different functionality can be implemented in a tuning method in which each portion is used subsequently to individually and independently control the impedance at both the first and second frequencies using this network, and the portion division is divided in any given case by the current operating code which sets the value for all capacitors and the operating frequency. In all cases, a heuristic (AI) tuning algorithm can try to find out which capacitor determines the split in an iterative manner as codes are changed, to use the first and second portions to tune the impedance to the target impedances at both the first and second frequencies. It must be noted that this individual tuning is an important aim and advantage of the given structure.

Note that in both FIGS. 7 and 9, respectively C10 and C7 are the first capacitors that cause completely disconnected tuning as a control algorithm would use the impedance stages starting at the lower portion closer to the input port towards the higher portion closer to the last impedance stage. In both cases, there exist a few capacitors prior to those capacitors that define a cross-over region 25 where step-by-step less control is exercised over the impedance at the second frequency.

Figure 11:
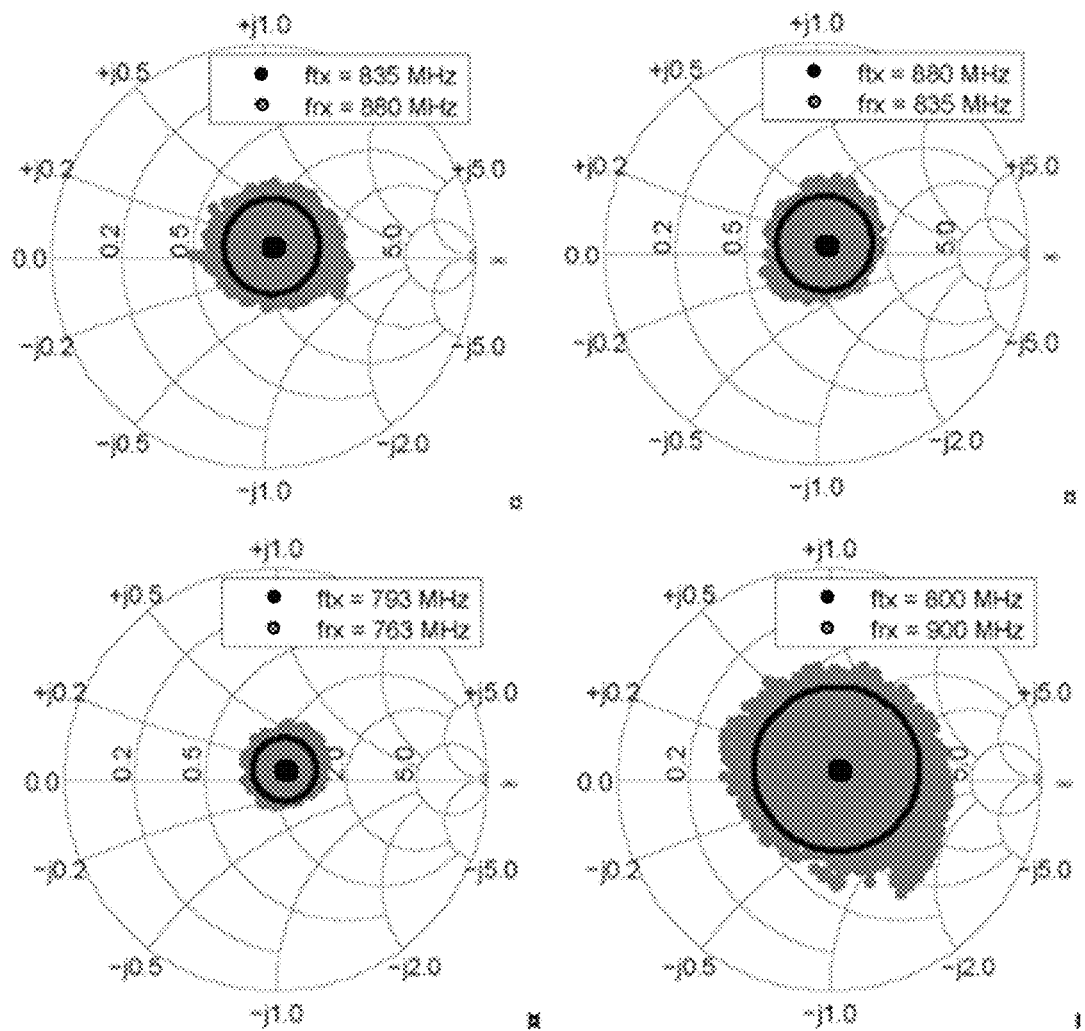
FIG. 11 shows four representative cases of specRX=1.2%Ω/MHz (w.r.t. 800 MHz) for a balance network that was fabricated in a 0.18 μm RF SOI CMOS technology.
Figure 12:
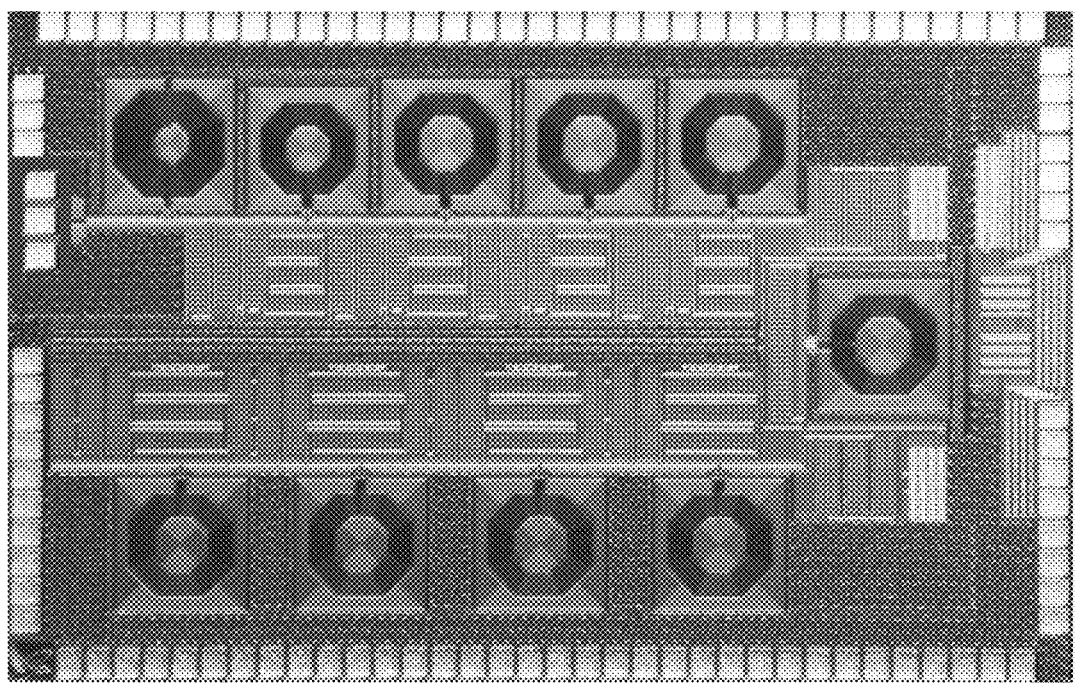
FIG. 12 shows a die micrograph of the balance network that was fabricated in a 0.18 μm RF SOI CMOS technology.

FIG. 11 shows four representative cases of specRX=1.2%Ω/MHz (w.r.t. 800 MHz) for a balance network that was fabricated in a 0.18 µm RF SOI CMOS technology, with an active area of 8.28 mm2, a die micrograph of which is shown in FIG. 12. For testing, the network was directly probed and de-embedded up to the GSG input pads not indicated in the die micrograph of FIG. 12.

TABLE 3

MEASURED PERFORMANCE SUMMARY

| | |
|---|---|
| Technology | 0.18 µm RF SOI CMOS |
| Chip area | 8.28 mm$^2$ (3.6 mm × 2.3 mm) |
| Operating range | 700 MHz-1 GHz |
| Tuning Spec Tx | 54 + j5 Ω, 1.1:1 VSWR |
| Tuning Spec Rx | 1.2% Ω/MHz (w.r.t. 800 MHz) |
| LTE bands validated | 5, 6, 8, 12, 13, 14, 17, 18, 19, 20 |
| IIP3 (typ.) | +42 dBm |

Table 3 reports specs for the case of $Z_{0,TX}$=54+j5Ω. These are valid for all 10 LTE bands in the 700 MHz to 1 GHz range. When $Z_{0,TX}$=50Ω, specRX shrinks to 1.0% Ω/MHz (w.r.t. 800 MHz). Validation was conducted by iteratively programming 1.85×10$^6$ random network configurations into the chip, and saving the S11 spectrum of each. This large dataset was then carefully analyzed to determine the maximum specRX that can be supported for various specTX's. Four noteworthy specRX visualizations are plotted in FIG. 11. The black circles represent the specRX boundary for a fTX center impedance at $Z_{0,TX}$=54+j5Ω. At top left is LTE band 5, and at top right is band 5 with fTX and fRX swapped. This comparison demonstrates that similar tuning behavior occurs for either ordering of fTX and fRX. The lower left plot is LTE band 14 (fTX−fRX=30 MHz). The lower right plot is a non-standard band with 100 MHz TX/RX spacing. These plots demonstrate that the network generates well shaped, fully filled specRX regions that scale relative to the band spacing. In general, these 4 plots also demonstrate how a single spec TX/specRX can accurately describe the underlying performance of the impedance network across many different band spacings and absolute frequency locations.

The custom tuning algorithm incorporating the concepts described above was implemented. It was tested across a systematic sweep of the complete spec TX and specRX ranges for all 10 LTE bands. The algorithm found solutions with ≥40 dB matching (at both fTX and fRX) in 479 trials on average, with σ=605, median=259, and max=4304. The only input to the algorithm was the magnitude of matching at fTX and fRX. A random network setting was used to initialize each search and no memory of previous searches was used. This illustrates that the described network topology and tuning method reduce the tuning complexity from ~10$^{34}$ possible codes to 479 on average for all 10 LTE bands.

In the above the disclosure has mainly been described with reference to a limited number of embodiments. However, as is readily appreciated by a person skilled in the art, other embodiments than the ones disclosed above are equally possible within the scope of the disclosure, as defined by the appended claims.

What is claimed is:

1. An integrated tunable impedance network (Zbal) configured to provide an impedance that matches a target impedance at a first frequency and simultaneously at a second frequency, the first and second frequencies being different from each, the tunable impedance network comprising:

an input port and at least one impedance branch with a plurality of reactive elements and associated tuning components connected to the input port, wherein the at least one impedance branch of the integrated tunable impedance network consists of the reactive elements and associated tuning components without any resistors;

wherein the integrated tunable impedance network comprises a plurality of repeating, series-connected cells, the plurality of cells serving as one impedance branch defined as a sequence of tunable impedance stages divided into a first portion (set of cells) and a second portion (set of cells), each cell consisting of a first variable capacitance (C2, C4, C6, C8, . . . ) in parallel with a fixed inductance (L2, L3, L4, L5, . . . ) between a first node and a second node as well as a second variable capacitance (C3, C5, C7, C9, . . . ) between the second node and ground, the first node of each stage being connected to the second node of a previous stage;

wherein, in each cell of the impedance branch, the number of reactive elements and associated tuning components, their topology and their reactance values are set such that the impedance branch is tunable to match the target impedance at the first frequency via mainly the first portion of the impedance branch and to match the target impedance at the second frequency via mainly the second portion of the impedance branch, the first portion being closer to the input port than the second portion and reducing the influence of the tuning of the second portion at the first frequency.

2. The integrated tunable impedance network according to claim 1, wherein, in the at least one impedance branch, the number of reactive elements and associated tuning components, their topology and their reactance values are such that the respective impedance branch is tunable to match substantially any impedance within a predetermined region on the complex plane around the target impedance to track for impedance variation at the first and second frequencies.

3. The integrated tunable impedance network according to claim 2, wherein the integrated tunable impedance network comprises an input portion at the input port, provided for shifting the impedance of the network on the complex plane simultaneously at the first and second frequencies.

4. The integrated tunable impedance network according to claim 3, wherein the input portion comprises a variable capacitance (C1) in parallel with a fixed inductance (L1) between the input port and ground.

5. The integrated tunable impedance network according to claim 2, wherein, in each of the at least one impedance branch, the number of reactive elements and associated tuning components, their topology and their reactance values are such that the respective impedance branch is tunable to match the target impedance at the first frequency via mainly a first portion of the impedance branch and to match the target impedance at the second frequency via mainly a second portion of the impedance branch, the first portion being closer to the input port than the second portion and reducing the influence of the tuning of the second portion at the first frequency.

6. The integrated tunable impedance network according to claim 1, wherein the integrated tunable impedance network comprises an input portion at the input port, provided for shifting the impedance of the network on the complex plane simultaneously at the first and second frequencies.

7. The integrated tunable impedance network according to claim 6, wherein the input portion comprises a variable capacitance (C1) in parallel with a fixed inductance (L1) between the input port and ground.

8. The integrated tunable impedance network according to claim 1, wherein the sequence of impedance stages comprises a first set of impedance stages wherein the first variable capacitance (C2, C4, C6, C8, C10) has a same first tuning range and wherein the second variable capacitance (C1, C3, C5, C7, C9, C11) has a same second tuning range, and a second set of impedance stages wherein the first and second variable capacitances (C12-C19) have a same third tuning range.

9. The integrated tunable impedance network according to claim 1, wherein, from a perspective of the input port, the topology comprises an arrangement of the cells where the stages of the first portion of the impedance branch, located at the input, transform the impedance of the subsequent stages so that a cumulative effect of impedance transformations in the subsequent stages (second portion) produces signals that are transformed to a relatively higher impedance at the higher frequency of interest within each respective impedance branch, such that the lower frequency encounters the impedance of the rear stages at a level greater than the higher frequency encounters the impedance of the rear stages.

10. The integrated tunable impedance network according to claim 1, wherein the integrated tunable impedance network comprises an input portion at the input port, provided for shifting the impedance of the network, wherein the input portion comprises a variable capacitance (C1) in parallel with a fixed inductance (L1) between the input port and ground.

11. A telecommunications device comprising:
an electrical-balance duplexer, EBD, circuit coupled to at least one output node of a transmit path (TXin), an antenna, and at least one input node of a receive path (RXout), the EBD circuit being configured to isolate the transmit path from the receive path by signal cancellation; and
a balancing network (Zbal) as part of the EBD circuit, the balancing network comprising an integrated tunable impedance network comprising reactive elements and associated tuning components;
wherein the integrated tunable impedance network comprises a plurality of repeating, series-connected cells, the plurality of cells serving as an impedance branch defined as a sequence of impedance stages (cells) divided into a first portion (set of cells) and a second portion (set of cells), each cell consisting of a first variable capacitance (C2, C4, C6, C8, . . . ) in parallel with a fixed inductance (L2, L3, L4, L5, . . . ) between a first node and a second node as well as a second variable capacitance (C3, C5, C7, C9, . . . ) between the second node and ground, the first node of each stage being connected to the second node of a previous stage;
wherein the balancing network and the integrated tunable impedance network are configured to provide an impedance that matches a target impedance (Zant) associated with the antenna at a first frequency and simultaneously at a second frequency, the first and second frequencies being different from each other; and
wherein the integrated tunable impedance network comprises an input port and at least one impedance branch with a plurality of reactive elements and associated tuning components connected to the input port, wherein the number of reactive elements and associated tuning components, their topology and their reactance values are such that the impedance branch is tunable to match the target impedance at the first frequency via mainly the first portion of the impedance branch and to match the target impedance at the second frequency via mainly the second portion of the impedance branch, the first portion being closer to the input port than the second portion and reducing the influence of the tuning of the second portion at the first frequency.

12. The telecommunications device according to claim 7, wherein, in the at least one impedance branch, the number of reactive elements and associated tuning components, their topology and their reactance values are such that the respective impedance branch is tunable to match substantially any impedance within a predetermined region on the complex plane around the target impedance to track for impedance variation of the antenna (Zant) at the first and second frequencies.

13. The telecommunications device according to claim 12, wherein the integrated tunable impedance network comprises an input portion at the input port, provided for shifting the impedance of the network on the complex plane simultaneously at the first and second frequencies.

14. The telecommunications device according to claim 13, wherein the input portion comprises a variable capacitance (C1) in parallel with a fixed inductance (L1) between the input port and ground.

15. The telecommunications device according to claim 7, wherein the integrated tunable impedance network comprises an input portion at the input port, provided for shifting the impedance of the network on the complex plane simultaneously at the first and second frequencies.

16. The telecommunications device according to claim 15, wherein the input portion comprises a variable capacitance (C1) in parallel with a fixed inductance (L1) between the input port and ground.

17. The telecommunications device according to claim 7, wherein the sequence of impedance stages comprises a first set of impedance stages wherein the first variable capacitance (C2, C4, C6, C8, C10) has a same first tuning range and wherein the second variable capacitance (C1, C3, C5, C7, C9, C11) has a same second tuning range, and a second set of impedance stages wherein the first and second variable capacitances (C12-C19) have a same third tuning range.

18. The telecommunications device according to claim 11, wherein, from a perspective of the input port, the topology comprises an arrangement of the cells where the stages of the first portion of the impedance branch, located at the input, transform the impedance of the subsequent stages so that a cumulative effect of impedance transformations in the subsequent stages (second portion) produces signals that are transformed to a relatively higher impedance at the higher frequency of interest within each respective impedance branch, such that the lower frequency encounters the impedance of the rear stages at a level greater than the higher frequency encounters the impedance of the rear stages.

* * * * *